(12) United States Patent
Kobayashi et al.

(10) Patent No.: US 9,169,342 B2
(45) Date of Patent: Oct. 27, 2015

(54) HIGHLY ABRASION-RESISTANT IMPRINT MATERIAL CONTAINING URETHANE COMPOUND

(75) Inventors: Junpei Kobayashi, Funabashi (JP); Keisuke Shuto, Funabashi (JP); Taku Kato, Funabashi (JP); Masayoshi Suzuki, Funabashi (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 14 days.

(21) Appl. No.: 13/980,376

(22) PCT Filed: Jan. 18, 2012

(86) PCT No.: PCT/JP2012/050960
§ 371 (c)(1),
(2), (4) Date: Jul. 18, 2013

(87) PCT Pub. No.: WO2012/099164
PCT Pub. Date: Jul. 26, 2012

(65) Prior Publication Data
US 2013/0296456 A1 Nov. 7, 2013

(30) Foreign Application Priority Data

Jan. 19, 2011 (JP) .................. 2011-008928
Jun. 23, 2011 (JP) .................. 2011-139403

(51) Int. Cl.
| | |
|---|---|
| *C08F 236/22* | (2006.01) |
| *B82Y 10/00* | (2011.01) |
| *B82Y 40/00* | (2011.01) |
| *G03F 7/00* | (2006.01) |
| *C08G 18/67* | (2006.01) |
| *C08G 18/42* | (2006.01) |
| *C08G 81/00* | (2006.01) |
| *C08F 299/04* | (2006.01) |
| *H01L 31/00* | (2006.01) |
| *H01L 33/00* | (2010.01) |
| *G03F 7/027* | (2006.01) |
| *G03F 7/035* | (2006.01) |
| *C08G 18/79* | (2006.01) |
| *H01L 27/146* | (2006.01) |

(52) U.S. Cl.
CPC .............. *C08F 236/22* (2013.01); *B82Y 10/00* (2013.01); *B82Y 40/00* (2013.01); *C08F 299/0492* (2013.01); *C08G 18/4277* (2013.01); *C08G 18/672* (2013.01); *C08G 18/792* (2013.01); *C08G 81/00* (2013.01); *G03F 7/0002* (2013.01); *G03F 7/027* (2013.01); *G03F 7/035* (2013.01); *H01L 31/00* (2013.01); *H01L 33/00* (2013.01); *C08L 2205/04* (2013.01); *C08L 2205/05* (2013.01); *H01L 27/14683* (2013.01); *H01L 2924/0002* (2013.01)

(58) Field of Classification Search
CPC ............ C08F 236/22; C08F 299/0492; C08G 18/792; C08G 18/672; C08G 18/00; C08G 18/4277; H01L 33/00; H01L 31/00; C08L 2205/04; C08L 2205/05; B82Y 40/00; B82Y 10/00; G03F 7/0002; G03F 7/027; G03F 7/035
See application file for complete search history.

(56) References Cited

U.S. PATENT DOCUMENTS

| | | | | |
|---|---|---|---|---|
| 4,844,144 | A * | 7/1989 | Murphy et al. ................. | 164/35 |
| 5,772,905 | A | 6/1998 | Chou | |
| 8,460,568 | B2 * | 6/2013 | David et al. ..................... | 216/67 |
| 2005/0148739 | A1 | 7/2005 | Hara et al. | |
| 2007/0004817 | A1 | 1/2007 | Hara et al. | |
| 2007/0049653 | A1 | 3/2007 | Hara et al. | |
| 2007/0049654 | A1 | 3/2007 | Hara et al. | |
| 2008/0125550 | A1 | 5/2008 | Hara et al. | |

FOREIGN PATENT DOCUMENTS

| | | |
|---|---|---|
| JP | A-2004-244426 | 9/2004 |
| JP | A-2008-105414 | 5/2008 |
| JP | A-2008-202022 | 9/2008 |

OTHER PUBLICATIONS

International Search Report issued in International Patent Application No. PCT/JP2012/050960 dated Mar. 13, 2012.
International Preliminary Report on Patentability issued in International Patent Application No. PCT/JP2012/050960 dated Jul. 23, 2013.
Jun. 1, 2015 Office Action issued in Chinese Application No. 201280005465.5.

\* cited by examiner

*Primary Examiner* — Sanza McClendon
(74) *Attorney, Agent, or Firm* — Oliff PLC

(57) ABSTRACT

There is provided an imprint material forming a film having high abrasion resistance even after a pattern has been transferred thereto, specifically an imprint material forming a film having a small number of pieces of scratch when the film after a pattern has been transferred thereto is subjected to a steel wool abrasion test. An imprint material comprising: a component (A): a compound having at least one ethylene oxide unit and having at least one polymerizable group; a component (B): a polycaprolactone-modified urethane compound having a $C_{13\text{-}25}$ long chain alkyl group and at least one polymerizable group; and a component (C): a photopolymerization initiator.

14 Claims, No Drawings

HIGHLY ABRASION-RESISTANT IMPRINT MATERIAL CONTAINING URETHANE COMPOUND

TECHNICAL FIELD

The present invention relates to an imprint material and a film which is produced from the material and to which a pattern is transferred. More in detail, the present invention relates to an imprint material forming a film having high abrasion resistance even after a pattern has been transferred thereto, and a film which is produced from the material and to which a pattern is transferred.

BACKGROUND ART

In 1995, a professor Chou who is currently a professor at Princeton University et al. have advocated a new technology called nano-imprint lithography (Patent Document 1). The nano-imprint lithography is a technology by which: a mold having any pattern is brought to contact with a base material on which a resin film is formed; and while the resin film is pressurized, heat or light is applied as an external stimulation to the resin film to form an objective pattern in the cured resin film. The nano-imprint lithography has such advantages of capable of processing in nano scale simply and inexpensively in comparison with photolithography and the like in conventional semiconductor device production.

Accordingly, the nano-imprint lithography is a technology expected to be applied to the production of semiconductor devices, optodevices, displays, storage mediums, biochips, and the like instead of the photolithography technology. Various reports have been made on a curable composition for photo nano-imprint lithography used for the nano-imprint lithography (Patent Document 2, Patent Document 3).

However, although hitherto various materials have been disclosed as a material used for the nano-imprint lithography (hereinafter in the present specification, called an "imprint material"), there is no report on a material that is subjected to an abrasion test after a structure such as a concavo-convex pattern has been produced in the material and that exhibits, as the result thereof, that the material maintains high abrasion resistance. On the other hand, in products such as solid-state image sensors, solar batteries, LED devices, and displays, abrasion resistance may be required for a structure produced in the inside of or on the surface of the products.

PRIOR ART DOCUMENTS

Patent Documents

Patent Document 1: U.S. Pat. No. 5,772,905 Specification
Patent Document 2: Japanese Patent Application Publication No. 2008-105414 (JP 2008-105414 A)
Patent Document 3: Japanese Patent Application Publication No. 2008-202022 (JP 2008-202022 A)

SUMMARY OF THE INVENTION

Problem to be Solved by the Invention

The present invention has been made according to the above circumstances and it is an object of the present invention to provide an imprint material forming a film having high abrasion resistance even after a pattern has been transferred thereto and to provide a film which is produced from the material and to which a pattern is transferred. Specifically, it is an object of the present invention to provide an imprint material forming a film having a small number of pieces of scratch, for example, 20 pieces or less when the film after a pattern has been transferred thereto is subjected to a steel wool abrasion test.

In the present specification, the photo nano-imprint lithography technology is called a photoimprint, in which the size of a formed pattern is not only of the order of a nanometer, but also, for example, of the order of a micrometer.

Means for Solving the Problem

As a result of assiduous research for solving the above problems, the inventors of the present invention have obtained such a marvelous finding that by using as an imprint material, a material containing a compound containing an ethylene oxide unit and having a polymerizable group, a urethane compound, and a photopolymerization initiator, a film which is produced from the material and to which a pattern is transferred causes a small amount of scratch when the film is subjected to a steel wool abrasion test on the pattern, and have completed the present invention.

That is, the present invention relates to, according to a first aspect, an imprint material comprising:

a component (A): a compound having at least one ethylene oxide unit and having at least one polymerizable group;

a component (B): a polycaprolactone-modified urethane compound having a $C_{13\text{-}25}$ long chain alkyl group and at least one polymerizable group; and a component (C): a photopolymerization initiator.

The present invention relates to, according to a second aspect, the imprint material according to the first aspect, in which the concentration of the ethylene oxide unit per one molecule of the compound of the component (A) is 20% or more and 80% or less.

The present invention relates to, according to a third aspect, the imprint material according to the first aspect or the second aspect, in which the component (B) is a compound obtained by causing a reaction product between an organic isocyanate having in one molecule thereof, at least three isocyanate groups and an alcohol having a $C_{13\text{-}25}$ long chain alkyl group to react with polycaprolactone-modified hydroxyethyl (meth)acrylate.

The present invention relates to, according to a fourth aspect, the imprint material according to any one of the first aspect to the third aspect, in which the component (A) comprises at least two compounds.

The present invention relates to, according to a fifth aspect, the imprint material according to any one of the first aspect to the fourth aspect, in which a ratio of the component (B) relative to the total mass of the component (A) and the component (B) is 10% by mass to 90% by mass.

The present invention relates to, according to a sixth aspect, the imprint material according to any one of the first aspect to the fifth aspect, further comprising a surfactant as a component (D).

The present invention relates to, according to a seventh aspect, the imprint material according to any one of the first aspect to the sixth aspect, further comprising a solvent as a component (E).

The present invention relates to, according to an eighth aspect, the imprint material according to the first aspect or the second aspect, characterized in that the component (A) and the component (B) are each a compound having as the polymerizable group, at least one selected from the group consisting of an acryloyloxy group, a methacryloyloxy group, a vinyl group, and an allyl group.

The present invention relates to, according to a ninth aspect, a film to which a pattern is transferred, the film being produced from the imprint material as described in any one of the first aspect to the eighth aspect.

The present invention relates to, according to a tenth aspect, a member comprising the film to which a pattern is transferred as described in the ninth aspect on a base material.

The present invention relates to, according to an eleventh aspect, a solid-state image sensor comprising the film to which a pattern is transferred as described in the ninth aspect on a base material.

The present invention relates to, according to a twelfth aspect, an LED device comprising the film to which a pattern is transferred as described in the ninth aspect on a base material.

The present invention relates to, according to a thirteenth aspect, a solar battery comprising the film to which a pattern is transferred as described in the ninth aspect on a base material.

The present invention relates to, according to a fourteenth aspect, a display comprising the film to which a pattern is transferred as described in the ninth aspect on a base material.

The present invention relates to, according to a fifteenth aspect, an electronic device comprising the film to which a pattern is transferred as described in the ninth aspect on a base material.

Effects of the Invention

In the imprint material of the present invention, a compound having at least one ethylene oxide unit and having at least one polymerizable group in the molecule thereof and a polycaprolactone-modified urethane compound having a $C_{13-25}$ long chain alkyl group and at least one polymerizable group are used. Therefore, a film which is produced from the imprint material and to which a pattern is transferred causes a small amount of scratch when the film is subjected to a steel wool abrasion test on the pattern.

The imprint material of the present invention is photocurable and during mold-releasing, peeling of a part of the pattern does not occur, so that a film in which a desired pattern is accurately formed can be obtained. Accordingly, a favorable pattern of the optical imprint can be formed.

The imprint material of the present invention can form a film on any base material, and a film to which a pattern formed after imprinting is transferred can be suitably applied to products using a member for which abrasion resistance is required such as solar batteries, LED devices, and displays.

Furthermore, the imprint material of the present invention can control the curing rate, the dynamic viscosity, and the film thickness by varying the type and the content ratio of the compound of the component (A). Accordingly, the imprint material of the present invention can design a material according to the type of produced device and the types of exposure process and baking process and can enlarge the process margin, so that the imprint material of the present invention can be suitably applied to the production of an optical member.

MODES FOR CARRYING OUT THE INVENTION

The present invention has an object of solving a problem of imparting abrasion resistance to a film after a pattern has been transferred thereto and is characterized in that for the imprint material, a compound having at least one ethylene oxide unit and having at least one polymerizable group and a polycaprolactone-modified urethane compound having a $C_{13-25}$ long chain alkyl group and at least one polymerizable group are adopted.

That is, the present invention is an imprint material comprising a component (A): a compound having at least one ethylene oxide unit and having at least one polymerizable group, a component (B): a polycaprolactone-modified urethane compound having a $C_{13-25}$ long chain alkyl group and at least one polymerizable group, and a component (C): a photopolymerization initiator. In addition, the present invention is an imprint material capable of comprising besides the component (A), the component (B), and the component (C), further a surfactant as a component (D) and a solvent as a component (E), and further if desired, other components.

Hereinafter, each component is described in detail.

<Component (A)>

The compound as the component (A) is a compound having one or more ethylene oxide unit(s) in one molecule thereof and having one or more polymerizable group(s) at a molecule terminal thereof. The component (A) contained in the present invention can impart abrasion resistance to a film after a pattern has been transferred thereto.

The polymerizable group refers to, for example, at least one type of organic group selected from the group consisting of an acryloyloxy group, an acryloyl group, a methacryloyloxy group, a methacryloyl group, a vinyl group, and an allyl group. Here, the acryloyloxy group may be expressed as an acryloxy group and the methacryloyloxy group may be expressed as a methacryloxy group.

As the content of an ethylene oxide unit in one molecule of the compound of the component (A), in the calculation of the molecular weight, the ethylene oxide unit concentration in one molecule is preferably 20% or more and 80% or less. Here, in the present invention, the ethylene oxide unit concentration represents a ratio of the molecular weight of the ethylene oxide unit of the compound as the component (A) relative to the molecular weight of the compound. When the component (A) contained in the present invention comprises two compounds, the ethylene oxide unit concentration to which Formula (F) described below is applied is 20% or more and 80% or less.

When the component (A) comprises a compound $A_1$ and a compound $A_2$ and contains x % by mass (x is a positive number satisfying 0<x<100) of the compound $A_1$ and (100-x) % by mass of the compound $A_2$, the ethylene oxide unit concentration (%) is expressed by Formula (F) below. Here, the molecular weight of one piece of the ethylene oxide unit in the compound $A_1$ and the compound $A_2$ is assumed to be 44; the numbers of ethylene oxide units per one molecule of the compounds $A_1$ and $A_2$ are assumed to be $n_{A1}$ and $n_{A2}$, respectively; and the molecular weights of the compounds $A_1$ and $A_2$ are assumed to be $M_{A1}$ and $M_{A2}$, respectively.

$$100[(44 \times n_{A1} \times x)+(44 \times n_{A2} \times (100-x))]/[(M_{A1} \times x)+(M_{A2} \times (100-x))] \quad (F)$$

When the component (A) comprises one compound that is the compound $A_1$, the ethylene oxide unit concentration is expressed by Formula (G) below obtained by applying x=100 to Formula (F).

$$100(44 \times n_{A1})/M_{A1} \quad (G)$$

Examples of the compound as the component (A) include methoxy polyethylene glycol acrylate, methoxy polyethylene glycol methacrylate, phenoxy polyethylene glycol acrylate, phenoxy polyethylene glycol methacrylate, ethylene glycol diacrylate, ethylene glycol dimethacrylate, polyethylene glycol diacrylate, polyethylene glycol dimethacrylate, ethoxylated bisphenol A diacrylate, ethoxylated bisphenol A dimethacrylate, ethoxylated trimethylolpropane triacrylate, ethoxylated trimethylolpropane trimethacrylate, ethoxylated glycerin triacrylate, ethoxylated glycerin trimethacrylate, ethoxylated pentaerythritol tetraacrylate, ethoxylated pentaerythritol tetramethacrylate, and ethoxylated dipentaerythritol hexaacrylate.

The compound as the component (A) is commercially available and specific examples thereof include NK ester AM-300, AM-900, AM-130G, AM-230Q AMP-10G, AMP-200Y, AMP-600, PHE-1G, A-200, A-400, A-600, A-1000, 1G, 20, 3G, 4G, 9G, 14G, 23G, ABE-300, A-BPE-4, A-BPE-6, A-BPE-10, A-BPE-20, A-BPE-30, BPE-80N, BPE-100N, BPE-200, BPE-500, BPE-900, BPE-1300N, A-GLY-3E, A-GLY-9E, A-GLY-20E, A-TMPT-3EO, A-TMPT-9E0, ATM-4E, and ATM-35E (these compounds are manufactured by Shin-Nakamura Chemical Co., Ltd.), KAYARAD (registered trademark) DPEA-12, PEG400DA, THE-330, and RP-1040 (these compounds are manufactured by Nippon Kayaku Co., Ltd.), and M-210 and M-350 (these compounds are manufactured by Toagosei Co., Ltd.).

The compounds as the component (A) may be used individually or in combination of two or more thereof.

<Component (B)>

The urethane compound as the component (B) is characterized by having a $C_{13-25}$ long chain alkyl group and one or more polymerizable group(s) and being polycaprolactone-modified.

Examples of the polymerizable group include the groups exemplified in the description for the compound as the component (A), for example, at least one organic group selected from the group consisting of an acryloyloxy group, an acryloyl group, a methacryloyloxy group, a methacryloyl group, a vinyl group, and an allyl group.

The urethane compound as the component (B) of the present invention is, as described below, preferably a urethane compound obtained by: mixing an organic isocyanate (a) having in one molecule thereof, three or more isocyanate groups with an alcohol (b) having a $C_{13-25}$ long chain alkyl group (hereinafter in the present specification, also called "long chain alkyl alcohol") and causing the both to react with each other; and further adding a polycaprolactone-modified hydroxyethyl (meth)acrylate (c) to the reaction mixture to react therewith.

The organic isocyanate (a) can be obtained by modifying a diisocyanate monomer (a-1) having two isocyanate groups and has in one molecule thereof, at least three isocyanate groups. Examples of the modifying method of the diisocyanate monomer (a-1) include an isocyanurate modification, an adduct modification, and a Biuret modification.

Examples of the diisocyanate monomer (a-1) include tolylene diisocyanate (TDI) of Formula (1):

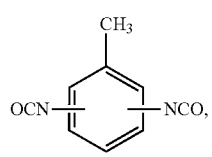

(1)

naphthalene diisocyanate (NDT) of Formula (2):

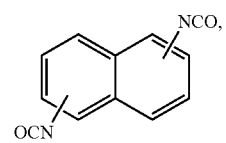

(2)

naphthalene diisocyanate (MD1) of Formula (3):

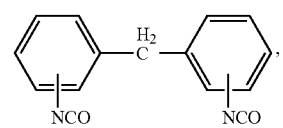

(3)

isophorone diisocyanate (IPDI) of Formula (4):

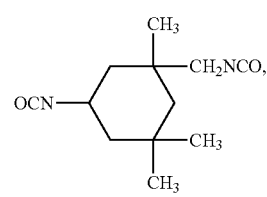

(4)

xylene diisocyanate (XDI) of Formula (5):

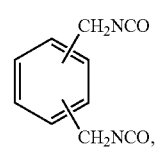

(5)

hexamethylene di isocyanate (HDI) of Formula (6):

OCN—(CH₂)₆—NCO (6)

dicyclohexylmethane diisocyanate (HDI) of Formula (7):

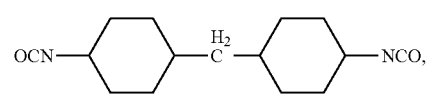

(7)

2,2,4-trimethylhexamethylene diisocyanate, lysine diisocyanate, and norbornane diisocyanate methyl.

Examples of the organic isocyanate (a) produced by isocyanurate-modifying the diisocyanate monomer (a-1) include compounds of General Formula (8):

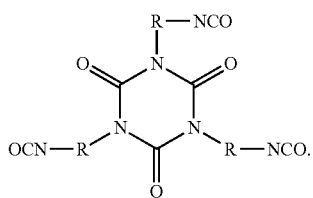

(8)

In General Formula (8), Rs are independently any one of seven types of divalent hydrocarbon groups below:

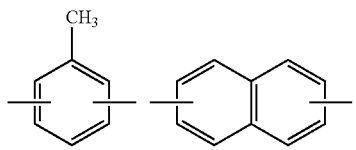

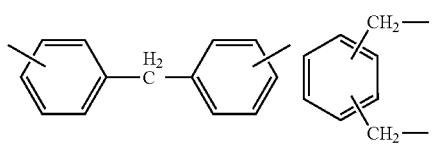

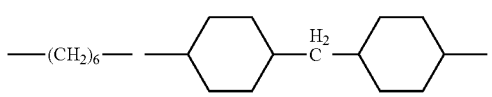

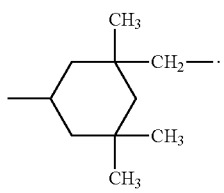

Examples of the organic isocyanate (a) produced by adduct-modifying the diisocyanate monomer (a-1) include compounds of General Formula (9).

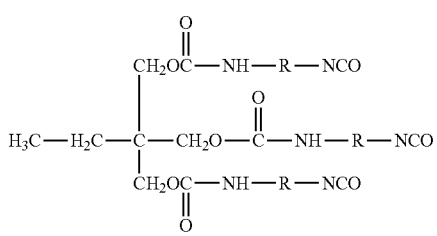

(9)

In General Formula (9), Rs are independently any one of the above seven divalent hydrocarbon groups.

Examples of the organic isocyanate (a) produced by Biuret-modifying the diisocyanate monomer (a-1) include compounds of General Formula (10).

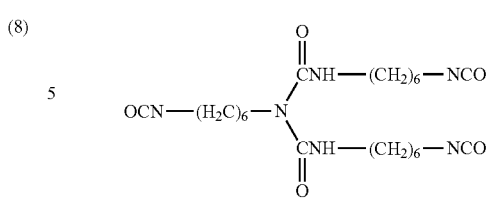

(10)

Examples of the $C_{13-25}$ long chain alkyl alcohol (b) include compounds having a $C_{13-25}$ long chain alkyl group such as tridecanol, myristyl alcohol, cetyl alcohol, stearyl alcohol, behenyl alcohol, polyoxyethylene monostearylate, polyoxyethylene cetyl ether, polyoxyethylene stearyl ether, and glycerol monostearylate.

Examples of the polycaprolactone-modified hydroxyethyl (meth)acrylate (c) include compounds of General Formula (11) below and the compounds have a hydroxy group having reactivity with an isocyanate group and have a polymerizable group of $CH_2=CH-$ or $CH_2=C(CH_3)-$.

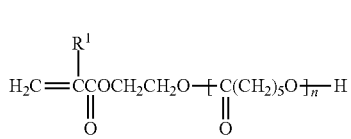

(11)

In General Formula (11), $R^1$ is H or a $CH_3$ group and n is an integer of 1 to 25, however, a preferred value of n is an integer of 2 to 5. By using a compound of General Formula (11) in which the value of n is an integer of 2 to 5, curing failure of the composition containing the component (A), the component (B), and the component (C) is more suppressed and favorable abrasion resistance and favorable self-recovery function of the composition are more exerted.

The content of the component (B) in the imprint material of the present invention is preferably 10% by mass to 90% by mass, more preferably 40% by mass to 60% by mass based on the total mass of the component (A) and the component (B).

<Synthesis of Component (B)>

As described above, the urethane compound as the component (B) is preferably a urethane compound obtained by: mixing the organic isocyanate (a) having in one molecule thereof, at least three isocyanate groups with the $C_{13-25}$ long chain alkyl alcohol (b) and causing the both to react with each other; and further adding the polycaprolactone-modified hydroxyethyl (meth)acrylate (c) to the reaction mixture to react therewith.

Both of the above reactions can be usually effected in a solution and an aromatic hydrocarbon solvent such as toluene and xylene, a ketone solvent such as acetone, methyl ethyl ketone, methyl isobutyl ketone, and cyclohexanone, and an ester solvent such as ethyl acetate, propyl acetate, isobutyl acetate, and butyl acetate are used as an individual solvent or a mixed solvent thereof.

Both of the above reactions can also be effected in a non-solvent system or in a compound having a polymerizable group such as styrene, isobornyl acrylate, acryloylmorpholine, diethylene glycol diacrylate, and triethylene glycol diacrylate.

For both of the above reactions, the reaction temperature is preferably normal temperature to 100° C. and the reaction time is preferably 1 to 10 hour(s). The mixing ratio of the organic isocyanate (a) and the polycaprolactone-modified hydroxyethyl (meth)acrylate (c) and the long chain alkyl alcohol (b) is preferably a mixing ratio by which a molar ratio between an isocyanate group of the organic isocyanate (a) and a hydroxy group of the polycaprolactone-modified hydroxyethyl (meth)acrylate (c) and a hydroxy group of the long chain alkyl alcohol (b) is 1:(0.8 to 1.20):(0.02 to 0.33).

During both of the above reactions, if necessary, a catalyst such as dibutyltin dilaurate, dibutyltin diethylhexoate, and dibutyltin sulfite may be used. The additive amount of the catalyst is preferably 0.01 to 1 part(s) by mass, more preferably 0.1 to 0.5 parts by mass relative to 100 parts by mass of the total of the organic isocyanate (a), the long chain alkyl alcohol (b), and the polycaprolactone-modified hydroxyethyl (meth)acrylate (c). Moreover, a polymerization inhibitor such as hydroquinone monomethyl ether may also be used. The additive amount of the polymerization inhibitor is preferably 0.01 to 1 part(s) by mass relative to 100 parts by mass of the total of the organic isocyanate (a), the long chain alkyl alcohol (b), and the polycaprolactone-modified hydroxyethyl (meth)acrylate (c).

<Component (C)>

Although the photopolymerization initiator as the component (C) is not particularly limited so long as the photopolymerization initiator has absorption relative to a light source used for photocuring, examples thereof include: organic peroxides such as tert-butylperoxy isobutarate, 2,5-dimethyl-2,5-bis(benzoyldioxy)hexane, 1,4-bis[α-(tert-butyldioxy)isopropoxy]benzene, di-tert-butyl peroxide, 2,5-dimethyl-2,5-bis(tert-butyldioxy)hexene hydroperoxide, α-(isopropylphenyl)isopropyl hydroperoxide, tert-butyl hydroperoxide, 1,1-bis(tert-butyldioxy)-3,3,5-trimethylcyclohexane, butyl-4,4-bis(tert-butyldioxy)valerate, cyclohexanone peroxide, 2,2',5,5'-tetra(tert-butylperoxycarbonyl)benzophenone, 3,3',4,4'-tetra(tert-butylperoxycarbonyl)benzophenone, 3,3',4,4'-tetra(tert-amylperoxycarbonyl)benzophenone, 3,3',4,4'-tetra(tert-hexylperoxycarbonyl)benzophenone, 3,3'-bis(tert-butylperoxycarbonyl)-4,4'-dicarboxybenzophenone, tert-butylperoxy benzoate, and di-tert-butyldiperoxy isophthalate; quinones such as 9,10-anthraquinone, 1-chloroanthraquinone, 2-chloroanthraquinone, octamethylanthraquinone, and 1,2-benzanthraquinone; benzoin derivatives such as benzoin methyl, benzoin ethyl ether, α-methylbenzoin, and α-phenylbenzoin; alkylphenone compounds such as 2,2-dimethoxy-1,2-diphenylethane-1-one, 1-hydroxy-cyclohexyl-phenyl-ketone, 2-hydroxy-2-methyl-1-phenylpropane-1-one, 1-[4-(2-hydroxyethoxy)phenyl]-2-hydroxy-2-methyl-1-propane-1-one, 2-hydroxy-1-[4-{4-(2-hydroxy-2-methylpropionyl)benzyl}phenyl]-2-methylpropane-1-one, phenylglyoxylic acid methyl ester, 2-methyl-[4-(methylthio)phenyl]-2-morpholinopropane-1-one, and 2-benzyl-2-dimethylamino-1-(4-(morpholinophenyl)butanone-1,2-dimethylamino-2-(4-m ethylbenzyl)-1-(4-morpholine-4-yl-phenyl)butane-1-one; acylphosphine oxide compounds such as bis(2,4,6-trimethylbenzoyl)phenylphosphine oxide, and 2,4,6-trimethylbenzoyldiphenylphosphine oxide; and oxime ester compounds such as 1,2-octane dione, 1-[4-(phenylthio)-, 2-(O-benzoyloxime)] and ethanone, 1-[9-ethyl-6-(2-methylbenzoyl)-9H-carbazole-3-yl]-, 1-(O-acetyloxime).

The above compounds are commercially available and specific examples thereof include IRGACURE (registered trademark) 651, 184, 500, 2959, 127, 754, 907, 369, 379, 379EG, 819, 819DW, 1800, 1870, 784, OXE01, OXE02, and 250, DAROCUR (registered trademark) 1173, MBF, and 4265, and Lucirin (registered trademark) TPO (these compounds are manufactured by BASF Japan Ltd.), KAYACURE (registered trademark) DETX, MBP, DMBI, EPA, and OA (these compounds are manufactured by Nippon Kayaku Co., Ltd.), VICURE-10 and -55 (these compounds are manufactured by Stauffer Chemical Company), ESACURE (registered trademark) KIP150, TZT, 1001, KTO46, KB1, KL200, KS300, EB3, triazine-PMS, triazine A, and triazine B (these compounds are manufactured by Nihon SiberHegner K.K.), and ADEKA OPTOMER N-1717, N-1414, and N-1606 (these compounds are manufactured by Adeka Corporation (former Asahi Denka Co. Ltd.)).

These photopolymerization initiators may be used individually or in combination of two or more thereof.

The content of the component (C) in the imprint material of the present invention is preferably 0.5 phr to 30 phr, more preferably 1 phr to 20 phr relative to the total mass of the component (A) and the component (B). This is because, when the content of the component (C) is 0.1 phr or less, satisfactory curability cannot be obtained to cause deterioration of patterning characteristics and lowering of abrasion resistance. Here, phr represents the mass of the photopolymerization initiator relative to 100 g of the total mass of the component (A) and the component (B).

<Component (D)>

In the present invention, a surfactant may be contained as the component (D). The surfactant as the component (D) performs a role of controlling film-forming property of the obtained coating film.

Examples of the surfactant include nonionic surfactants, for example polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenyl ether and polyoxyethylene nonylphenyl ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorinated surfactants, for example, EFTOP (registered trademark) EF301, EF303, and EF352 (trade name; manufactured by Mitsubishi Materials Electronic Chemicals Co., Ltd.), MEGAFAC (registered trademark) F171, F173, R-08, and R-30 (trade name; manufactured by DIC Corporation), Fluorad FC430 and FC431 (manufactured by Sumitomo 3M Limited), and AsahiGuard (registered trademark) AG710 and Surflon (registered trademark) S-382, SC101, SC102, SC103, SC104, SC105, and SC106 (trade name; manufactured by Asahi Glass Co., Ltd.); and Organosiloxane polymer KP341 (manufactured by Shin-Etsu Chemical Co., Ltd.) and BYK (registered trademark)-302, -307, -322, -323, -330, -333, -370, -375, -378, -UV3500, and -UV3570 (manufactured by BYK Japan KK).

These surfactants may be used individually or in combination of two or more thereof. When the surfactant is used, the ratio thereof is preferably 0.01 phr to 40 phr, more preferably 0.01 phr to 10 phr based on the total mass of the component (A) and the component (B).

<Component (E)>

In the present invention, a solvent may be contained as the component (E). The solvent as the component (E) performs a role of adjusting the viscosity of the compounds as the component (A) and the component (B).

Examples of the solvent include toluene, p-xylene, o-xylene, styrene, ethylene glycol dimethyl ether, propylene glycol monomethyl ether, ethylene glycol monomethyl ether, propylene glycol monoethyl ether, ethylene glycol monoethyl ether, ethylene glycol monoisopropyl ether, ethylene glycol methyl ether acetate, propylene glycol monomethyl ether acetate, ethylene glycol ethyl ether acetate, diethylene glycol dimethyl ether, propylene glycol monobutyl ether, ethylene glycol monobutyl ether, diethylene glycol diethyl ether, dipropylene glycol monomethyl ether, diethylene glycol monomethyl ether, dipropylene glycol monoethyl ether, diethylene glycol monoethyl ether, triethylene glycol dimethyl ether, diethylene glycol monoethyl ether acetate, diethylene glycol, 1-octanol, ethylene glycol, hexylene glycol, diacetone alcohol, furfuryl alcohol, tetrahydrofurfuryl alcohol, propylene glycol, benzyl alcohol, 1,3-butane diol, 1,4-butane diol, 2,3-butane diol, γ-butyrolactone, acetone, methyl ethyl ketone, methyl isopropyl ketone, diethyl ketone, methyl isobutyl ketone, methyl n-butyl ketone, cyclohexanone, 2-heptanone, ethyl acetate, isopropyl acetate, n-propyl acetate, isobutyl acetate, n-butyl acetate, ethyl lactate, methanol, ethanol, isopropanol, tert-butanol, allyl alcohol, n-propanol, 2-methyl-2-butanol, isobutanol, n-butanol, 2-methyl-1-butanol, 1-pentanol, 2-methyl-1-pentanol, 2-ethylhexanol, trimethylene glycol, 1-methoxy-2-butanol, isopropyl ether, 1,4-dioxolane, N,N-dimethylformamide, N,N-dimethylacetamide, N-methyl-2-pyrrolidone, 1,3-dimethyl-2-imidazolidinone, dimethylsulfoxide, and N-cyclohexyl-2-pyrrolidine, and the solvent is not particularly limited so long as the viscosities of the component (A) and the component (B) can be adjusted with the solvent.

These solvents may be used individually or in combination of two or more thereof.

<Other Additives>

The imprint material of the present invention can further contain, if necessary, at least one additive selected from the group consisting of an epoxy compound, a photoacid generator, a photosensitizer, an ultraviolet ray absorber, an antioxidant, an adhesion assistant, and a mold releasability enhancer so long as the effect of the present invention is not impaired.

The epoxy compound is a compound having an epoxy group or an oxirane ring and examples thereof include EPOLEAD (registered trademark) GT-401 and PB3600, CELLOXIDE (registered trademark) 2021P, 2000, 3000, EHPE3150, and EHPE3150CE, CYCLOMER (registered trademark) M100 (these compounds are manufactured by Daicel Chemical Industries, Ltd. (at present: Daicel Corporation)), and EPICLON (registered trademark) 840, 840-S, N-660, and N-673-80M (these compounds are manufactured by DIC Corporation).

Examples of the photoacid generator include IRGACURE (registered trademark) PAG103, PAG108, PAG121, PAG203, and CG1725, (these compounds are manufactured by BASF Japan Ltd.), WPAG-145, WPAG-170, WPAG-199, WPAG-281, WPAG-336, and WPAG-367 (these compounds are manufactured by Wako Pure Chemical Industries, Ltd.), and TFE-triazine, TME-triazine, MP-triazine, dimethoxytriazine, TS-91, and TS-01 (manufactured by Sanwa Chemical Co., Ltd.).

Examples of the photosensitizer include thioxanthene-based, xanthene-based, ketone-based, thiopyrylium-based, base styryl-based, merocyanine-based, 3-substituted coumarin-based, 3,4-substituted coumarin-based, cyanine-based, acridine-based, thiazine-based, phenothiazine-based, anthracene-based, coronene-based, benzanthracene-based, perylene-based, keto coumarin-based, coumarin-based, and borate-based photo sensitizers.

These photosensitizers may be used individually or in combination of two or more thereof. By using the photosensitizers, an absorption wavelength in a UV region can also be controlled.

Examples of the ultraviolet ray absorber include TINUV$_{IN}$ (registered trademark) PS, 99-2, 109, 328, 384-2, 400, 405, 460, 477, 479, 900, 928, 1130, 111 FDL, 123, 144, 152, 292, 5100, 400-DW, 477-DW, 99-DW, 123-DW, 5050, 5060, and 5151 (these compounds are manufactured by BASF Japan Ltd.).

These ultraviolet ray absorbers may be used individually or in combination of two or more thereof. By using the ultraviolet ray absorbers, during photo-curing, the curing rate at the outermost surface of the film may be controlled and the mold releasability may be enhanced.

Examples of the antioxidant include IRGANOX (registered trademark) 1010, 1035, 1076, 1135, and 1520L (these compounds are manufactured by BASF Japan Ltd.).

These antioxidants may be used individually or in combination of two or more thereof. The use of the antioxidants can prevent the film from being discolored into yellow by oxidation, Examples of the adhesion assistant include 3-methacryloxypropyltrimethoxysiane and 3-acryloxypropyltrimethoxysilane. By using the adhesion assistant, the adhesion of the film with a base material is enhanced. The content of the adhesion assistant is preferably 5 phr to 50 phr, more preferably 10 phr to 50 phr based on the total mass of the component (A) and the component (B).

Examples of the mold releasability enhancer include a silicone unit-containing compound and a fluorine-containing compound. Examples of the silicone unit-containing compound include X-22-164, X-22-164AS, X-22-164A, X-22-164B, X-22-164C, X-22-164E, X-22-163, X-22-169AS, X-22-174DX, X-22-2426, X-22-9002, X-22-2475, X-22-4952, KF-643, X-22-343, and X-22-2046 (these compounds are manufactured by Shin-Etsu Chemical Co., Ltd.). Examples of the fluorine-containing compound include R-5410, R-1420, M-5410, M-1420, E-5444, E-7432, A-1430, and A-1630 (these compounds are manufactured by Daikin Industries Ltd.).

The imprint material of the present invention can further contain a compound having at least one polymerizable group and having no ethylene oxide unit. The content of the compound is preferably 0.01 phr to 200 phr, more preferably 0.1 phr to 100 phr based on the total mass of the component (A) and the component (B).

Examples of the compound having at least one polymerizable group and having no ethylene oxide unit include acrylic acid, KAYARAD (registered trademark) NPGDA, PET-30, and DPHA (these compounds are manufactured by Nippon Kayaku Co., Ltd.). By using any one of these compounds, the viscosity of the imprint material of the present invention can be controlled.

<Preparation of Imprint Material>

Although the preparation method of the imprint material of the present invention is not particularly limited, it is satisfactory that the component (A), the component (B), the component (C), and as optional components, the component (D) and the component (E), and if desired, other additives are in a state in which they are homogeneously mixed. The order of mixing the component (A) to the component (E) and if desired, other additives is not a problem and is not particularly limited so long as a homogeneous solution can be obtained. Examples of the preparation method include a method of mixing the component (A) with the component (B) in a predetermined ratio. Examples thereof also include a method of further mixing the above resultant mixture with the component (C), the component (D), and the component (E) to prepare a homogeneous solution. Examples thereof further include a method of further adding, if desired, other additives to the reaction mixture in an appropriate step of the preparation method.

The imprint material of the present invention can obtain a desired coating film by being applied onto a base material and being photo-cured. Examples of the applying method include a publicly known or well-known method such as a spin coating method, a dipping method, a flow coating method, an inkjet method, a spraying method, a bar coating method, a gravure coating method, a slit coating method, a roll coating method, a transfer printing method, a brush coating method, a blade coating method, and an air knife coating method.

Examples of the base material onto which the imprint material of the present invention is applied include base materials such as silicon, glass (ITO substrate) on which indium tin oxide (ITO) is formed into a film, glass (SiN substrate) on which silicon nitride (SiN) is formed into a film, glass on which indium zinc oxide (IZO) is formed into a film, polyethylene terephthalate (PET), triacetylcellulose (TAC), acrylic resin, plastics, glass, quartz, and ceramics. Furthermore, a flexible base material having flexibility can also be used.

Although the light source for curing the imprint material of the present invention is not particularly limited, examples thereof include a high pressure mercury lamp, a low pressure mercury lamp, a metal halide lamp, a KrF excimer laser, an ArF excimer laser, an $F_2$ excimer laser, an electron beam (EB), and an extreme ultraviolet ray (EUV). As the wavelength, generally, a G ray of 436 nm, an H ray of 405 nm, an I ray of 365 nm, or a GER mixed ray can be used. Furthermore, the exposure value is preferably 30 mJ/cm$^2$ to 2,000 mJ/cm$^2$ and more preferably 30 mJ/cm$^2$ to 1,000 mJ/cm$^2$.

When the solvent as the component (E) is used, at least any one of the coating film before light irradiation and the coating film after light irradiation may also be subjected to a baking process as an additional process for the purpose of evaporating the solvent. The baking instrument is not particularly limited and may be a baking instrument, such as a hot plate, an oven, and a furnace, capable of baking in an appropriate atmosphere, that is, in the atmosphere, an inert gas such as nitrogen, or vacuum. Although the baking temperature is not particularly limited for the purpose of evaporating the solvent, the baking can be performed, for example, at 40° C. to 200° C.

Although the apparatus performing the optical imprint is not particularly limited so long as an objective pattern can be obtained, for example, a commercially available apparatus such as ST50 manufactured by Toshiba Machine Co., Ltd., Sindre (registered trademark) 60 manufactured by Obducat AB, and NM-0801 HB manufactured by Meisyo Kiko Co., Ltd. can be used.

Although examples of the mold material used for the optical imprint used in the present invention include quartz, silicon, nickel, alumina, carbonylsilane, and glassy carbon, the mold material is not particularly limited so long as an objective pattern can be obtained. The mold may be subjected to a mold-releasing treatment for forming a thin film of a fluorine-based compound or the like on the surface of the mold for enhancing the mold releasability. Although examples of a mold-releasing agent used for the mold-releasing treatment include OPTOOL (registered trademark) HD manufactured by Daikin Industries, Ltd., the mold-releasing agent is not particularly limited so long as an objective pattern can be obtained.

As the pattern of the optical imprint, a pattern conforming to an objective electronic device may be selected and the pattern size conforms also thereto. The pattern size is, for example, of the order of a nanometer or of the order of a micrometer.

EXAMPLES

Hereinafter, the present invention is described more in detail referring to Examples and Comparative Examples, which should not be construed as limiting the scope of the present invention.

Synthesis Example 1

Into a 500 mL-volume flask equipped with a stirrer, a thermometer, and a condenser, 60.8 parts by mass of toluene and 8.4 parts by mass of stearyl alcohol (NAA-46; manufactured by NOF Corporation; hydroxy group value: 207) were charged and the temperature of the resultant mixture was elevated to 40° C. Then, stearyl alcohol was confirmed to be completely dissolved and into the mixture, 50 parts by mass of an isocyanurate-modified type (TAKENATE (registered trademark) D-170N; manufactured by Mitsui Chemicals, Inc; NCO %: 20.9) of hexamethylene diisocyanate was charged, followed by elevating the temperature of the resultant mixture to 70° C. At the same temperature, the reaction was effected for 30 minutes and then, 0.02 parts by mass of dibutyltin dilaurate was charged into the reaction mixture, followed by maintaining the resultant reaction mixture at the same temperature for three hours. Then, into the reaction mixture, 83.5 parts by mass of polycaprolactone-modified hydroxyethyl acrylate (PLACCEL (registered trademark) FA2D; manufactured by Daicel Chemical Industries, Ltd. (at present: Daicel Corporation); hydroxy group value: 163), 0.02 parts by mass of dibutyltin dilaurate, and 0.02 parts by mass of hydroquinone monomethyl ether were charged and the resultant reaction mixture was maintained at 70° C. for three hours to terminate the reaction. Then, toluene was removed by an evaporator to obtain a urethane acrylate (I) having a solid content of 100% by mass.

Synthesis Example 2

Into a flask equipped similarly to Synthesis Example 1, 48.2 parts by mass of toluene and 4.2 parts by mass of stearyl alcohol (NAA-46) were charged and the temperature of the resultant mixture was elevated to 40° C. Then, stearyl alcohol was confirmed to be completely dissolved and into the mixture, 25 parts by mass of an isocyanurate-modified type (TAKENATE (registered trademark) D-170N) of hexamethylene diisocyanate was charged, followed by elevating the temperature of the resultant mixture to 70° C. At the same temperature, the reaction was effected for 30 minutes and then, 0.02 parts by mass of dibutyltin dilaurate was charged into the reaction mixture, followed by maintaining the resultant reaction mixture at the same temperature for three hours. Then, into the reaction mixture, 83.3 parts by mass of polycaprolactone-modified hydroxyethyl acrylate (PLACCEL (registered trademark) FA5; manufactured by Daicel Chemical Industries, Ltd. (at present: Daicel Corporation); hydroxy group value: 81.8), 0.02 parts by mass of dibutyltin dilaurate, and 0.02 parts by mass of hydroquinone monomethyl ether were charged and the resultant reaction mixture was maintained at 70° C. for three hours to terminate the reaction.

Then, toluene was removed by an evaporator to obtain a urethane acrylate (II) having a solid content of 100% by mass.

Synthesis Example 3

Into a flask equipped similarly to Synthesis Example 1, 44.8 parts by mass of toluene and 4.6 parts by mass of stearyl alcohol (NAA-46) were charged and the temperature of the resultant mixture was elevated to 40° C. Then, stearyl alcohol was confirmed to be completely dissolved and into the mixture, 50 parts by mass of a trimethylolpropane adduct-modified type (TAKENATE (registered trademark) D-110N; manufactured by Mitsui Chemicals, Inc.; N.V.: 75, NCO %: 11.5) of xylene diisocyanate was charged, followed by elevating the temperature of the resultant mixture to 70° C. At the same temperature, the reaction was effected for 30 minutes and then, 0.02 parts by mass of dibutyltin dilaurate was charged into the reaction mixture, followed by maintaining the resultant reaction mixture at the same temperature for three hours. Then, into the reaction mixture, 91.7 parts by mass of polycaprolactone-modified hydroxyethyl acrylate (PLACCEL (registered trademark) FA5), 0.02 parts by mass of dibutyltin dilaurate, and 0.02 parts by mass of hydroquinone monomethyl ether were charged and the resultant reaction mixture was maintained at 70° C. for three hours to terminate the reaction. Then, toluene was removed by an evaporator to obtain a urethane acrylate (III) having a solid content of 100% by mass.

Synthesis Example 4

Into a flask equipped similarly to Synthesis Example 1, 61.3 parts by mass of toluene and 9.7 parts by mass of behenyl alcohol (NAA-422; manufactured by NOF Corporation; hydroxy group value: 180) were charged and the temperature of the resultant mixture was elevated to 40° C. Then, behenyl alcohol was confirmed to be completely dissolved and into the mixture, 50 parts by mass of an isocyanurate-modified type (TAKENATE (registered trademark) D-170N) of hexamethylene diisocyanate was charged, followed by elevating the temperature of the resultant mixture to 70° C. At the same temperature, the reaction was effected for 30 minutes and then, 0.02 parts by mass of dibutyltin dilaurate was charged into the reaction mixture, followed by maintaining the resultant reaction mixture at the same temperature for three hours. Then, into the reaction mixture, 83.4 parts by mass of polycaprolactone-modified hydroxyethyl acrylate (PLACCEL (registered trademark) FA2D), 0.02 parts by mass of dibutyltin dilaurate, and 0.02 parts by mass of hydroquinone monomethyl ether were charged and the resultant reaction mixture was maintained at 70° C. for three hours to terminate the reaction. Then, toluene was removed by an evaporator to obtain a urethane acrylate (IV) having a solid content of 100% by mass.

[Preparation of Coating Liquid for Forming Film]

Example 1

4.5 g of NK ester A-TMPT-3EO (hereinafter in the present specification, abbreviated as "A-TMPT-3EO") (manufactured by Shin-Nakamura Chemical Co., Ltd.) was mixed with 0.5 g of the urethane acrylate (I) obtained in Synthesis Example 1 and to the resultant mixture, 0.25 g (5 phr based on the total mass of A-TMPT-3EO and the urethane acrylate (I)) of DAROCUR (registered trademark) 1173 (manufactured by BASF Japan Ltd.) (hereinafter in the present specification, abbreviated as "DAROCUR1173") was added to prepare an imprint material PNI-1A. A-TMPT-3EO used in the present Example and Examples described below corresponds to the component (A). The urethane acrylate (I) and DAROCUR1173 that are used in the present Example and Examples and Comparative Examples that are described below correspond to the component (B) and the component (C), respectively.

Example 2

In the same manner as in Example 1, except that the amount of A-TMPT-3EO and the amount of the urethane acrylate (I) in Example 1 were changed to 2.5 g and 2.5 g, respectively, an imprint material PNI-2A was prepared.

Example 3

In the same manner as in Example 1, except that the amount of A-TMPT-3EO and the amount of the urethane acrylate (I) in Example 1 were changed to 0.5 g and 4.5 g, respectively, an imprint material PNI-3A was prepared.

Example 4

4.5 g of NK ester (registered trademark) A-TMPT-9EO (hereinafter in the present specification, abbreviated as "A-TMPT-9EO") (manufactured by Shin-Nakamura Chemical Co., Ltd.) was mixed with 0.5 g of the urethane acrylate (I) obtained in Synthesis Example 1 and to the resultant mixture, 0.25 g (5 phr based on the total mass of A-TMPT-9EO and the urethane acrylate (I)) of DAROCUR1173 was added to prepare an imprint material PNI-4A. A-TMPT-9EO used in the present Example and Examples described below corresponds to the component (A).

Example 5

In the same manner as in Example 4, except that the amount of A-TMPT-9EO and the amount of the urethane acrylate (I) in Example 4 were changed to 2.5 g and 2.5 g, respectively, an imprint material PNI-5A was prepared.

Example 6

In the same manner as in Example 4, except that the amount of A-TMPT-9EO and the amount of the urethane acrylate (I) in Example 4 were changed to 0.5 g and 4.5 g, respectively, an imprint material PNI-6A was prepared.

Example 7

4.5 g of NK ester (registered trademark) ATM-4E (hereinafter in the present specification, abbreviated as "ATM-4E") (manufactured by Shin-Nakamura Chemical Co., Ltd.) was mixed with 0.5 g of the urethane acrylate (I) obtained in Synthesis Example 1 and to the resultant mixture, 0.25 g (5 phr based on the total mass of ATM-4E and the urethane acrylate (I)) of DAROCUR1173 was added to prepare an imprint material PNI-7A. ATM-4E used in the present Example and Examples described below corresponds to the component (A).

Example 8

In the same manner as in Example 7, except that the amount of ATM-4E and the amount of the urethane acrylate (I) in Example 7 were changed to 2.5 g and 2.5 g, respectively, an imprint material PNI-8A was prepared.

Example 9

In the same manner as in Example 7, except that the amount of ATM-4E and the amount of the urethane acrylate (I) in Example 7 were changed to 0.5 g and 4.5 g, respectively, an imprint material PNI-9A was prepared.

Example 10

4.5 g of KAYARAD (registered trademark) DPEA-12 (hereinafter in the present specification, abbreviated as "DPEA-12") (manufactured by Nippon Kayaku Co., Ltd.) was mixed with 0.5 g of the urethane acrylate (I) obtained in Synthesis Example 1 and to the resultant mixture, 0.25 g (5 phr based on the total mass of DPEA-12 and the urethane acrylate (I)) of DAROCUR1173 was added to prepare an imprint material PNI-10A. DPEA-12 used in the present Example and Examples described below corresponds to the component (A).

Example 11

In the same manner as in Example 10, except that the amount of DPEA-12 and the amount of the urethane acrylate (I) in Example 10 were changed to 2.5 g and 2.5 g, respectively, an imprint material PNI-11A was prepared.

Example 12

In the same manner as in Example 10, except that the amount of DPEA-12 and the amount of the urethane acrylate (I) in Example 10 were changed to 0.5 g and 4.5 g, respectively, an imprint material PNI-12A was prepared.

Example 13

4.5 g of A-TMPT-3EO was mixed with 0.5 g of the urethane acrylate (H) obtained in Synthesis Example 2 and to the resultant mixture, 0.25 g (5 phr based on the total mass of A-TMPT-3EO and the urethane acrylate (II)) of DAROCUR1173 was added to prepare an imprint material PNI-13A. The urethane acrylate (II) used in the present Example and Examples and Comparative Examples that are described below corresponds to the component (B).

Example 14

In the same manner as in Example 13, except that the amount of A-TMPT-3EO and the amount of the urethane acrylate (II) in Example 13 were changed to 2.5 g and 2.5 g, respectively, an imprint material PNI-14A was prepared.

Example 15

In the same manner as in Example 13, except that the amount of A-TMPT-3EO and the amount of the urethane acrylate (H) in Example 13 were changed to 0.5 g and 4.5 g, respectively, an imprint material PNI-15A was prepared.

Example 16

4.5 g of A-TMPT-9EO was mixed with 0.5 g of the urethane acrylate (II) obtained in Synthesis Example 2 and to the resultant mixture, 0.25 g (5 phr based on the total mass of A-TMPT-9EO and the urethane acrylate (II)) of DAROCUR1173 was added to prepare an imprint material PNI-16A.

Example 17

In the same manner as in Example 16, except that the amount of A-TMPT-9EO and the amount of the urethane acrylate (H) in Example 16 were changed to 2.5 g and 2.5 g, respectively, an imprint material PNI-17A was prepared.

Example 18

In the same manner as in Example 16, except that the amount of A-TMPT-9EO and the amount of the urethane acrylate (H) in Example 16 were changed to 0.5 g and 4.5 g, respectively, an imprint material PNI-18A was prepared.

Example 19

4.5 g of ATM-4E was mixed with 0.5 g of the urethane acrylate (H) obtained in Synthesis Example 2 and to the resultant mixture, 0.25 g (5 phr based on the total mass of ATM-4E and the urethane acrylate (II)) of DAROCUR1173 was added to prepare an imprint material PNI-19A.

Example 20

In the same manner as in Example 19, except that the amount of ATM-4E and the amount of the urethane acrylate (II) in Example 19 were changed to 2.5 g and 2.5 g, respectively, an imprint material PNI-20A was prepared.

Example 21

In the same manner as in Example 19, except that the amount of ATM-4E and the amount of the urethane acrylate (H) in Example 19 were changed to 0.5 g and 4.5 g, respectively, an imprint material PNI-21A was prepared.

Example 22

4.5 g of DPEA-12 was mixed with 0.5 g of the urethane acrylate (II) obtained in Synthesis Example 2 and to the resultant mixture, 0.25 g (5 phr based on the total mass of DPEA-12 and the urethane acrylate (II)) of DAROCUR1173 was added to prepare an imprint material PNI-22A.

Example 23

In the same manner as in Example 22, except that the amount of DPEA-12 and the amount of the urethane acrylate (II) in Example 22 were changed to 2.5 g and 2.5 g, respectively, an imprint material PNI-23A was prepared.

Example 24

In the same manner as in Example 22, except that the amount of DPEA-12 and the amount of the urethane acrylate (II) in Example 22 were changed to 0.5 g and 4.5 g, respectively, an imprint material PNI-24A was prepared.

Example 25

4.5 g of A-TMPT-3EO was mixed with 0.5 g of the urethane acrylate (III) obtained in Synthesis Example 3 and to the resultant mixture, 0.25 g (5 phr based on the total mass of A-TMPT-3EO and the urethane acrylate (HI)) of DAROCUR1173 was added to prepare an imprint material PNI-25A. The urethane acrylate (III) used in the present Example and Examples and Comparative Examples that are described below corresponds to the component (B).

Example 26

In the same manner as in Example 25, except that the amount of A-TMPT-3EO and the amount of the urethane acrylate (III) in Example 25 were changed to 2.5 g and 2.5 g, respectively, an imprint material PNI-26A was prepared.

Example 27

In the same manner as in Example 25, except that the amount of A-TMPT-3EO and the amount of the urethane acrylate (III) in Example 25 were changed to 0.5 g and 4.5 g, respectively, an imprint material PNI-27A was prepared.

Example 28

4.5 g of A-TMPT-9EO was mixed with 0.5 g of the urethane acrylate (III) obtained in Synthesis Example 3 and to the resultant mixture, 0.25 g (5 phr based on the total mass of A-TMPT-9EO and the urethane acrylate (III)) of DAROCUR1173 was added to prepare an imprint material PNI-28A.

Example 29

In the same manner as in Example 28, except that the amount of A-TMPT-9EO and the amount of the urethane acrylate (III) in Example 28 were changed to 2.5 g and 2.5 g, respectively, an imprint material PNI-29A was prepared.

Example 30

In the same manner as in Example 28, except that the amount of A-TMPT-9EO and the amount of the urethane acrylate (III) in Example 28 were changed to 0.5 g and 4.5 g, respectively, an imprint material PNI-30A was prepared.

Example 31

4.5 g of ATM-4E was mixed with 0.5 g of the urethane acrylate (III) obtained in Synthesis Example 3 and to the resultant mixture, 0.25 g (5 phr based on the total mass of ATM-4E and the urethane acrylate (III)) of DAROCUR1173 was added to prepare an imprint material PNI-31A.

Example 32

In the same manner as in Example 31, except that the amount of ATM-4E and the amount of the urethane acrylate (III) in Example 31 were changed to 2.5 g and 2.5 g, respectively, an imprint material PNI-32A was prepared.

Example 33

In the same manner as in Example 31, except that the amount of ATM-4E and the amount of the urethane acrylate (III) in Example 31 were changed to 0.5 g and 4.5 g, respectively, an imprint material PNI-33A was prepared.

Example 34

4.5 g of DPEA-12 was mixed with 0.5 g of the urethane acrylate (III) obtained in Synthesis Example 3 and to the resultant mixture, 0.25 g (5 phr based on the total mass of DPEA-12 and the urethane acrylate (III)) of DAROCUR1173 was added to prepare an imprint material PNI-34A.

Example 35

In the same manner as in Example 34, except that the amount of DPEA-12 and the amount of the urethane acrylate (III) in Example 34 were changed to 2.5 g and 2.5 g, respectively, an imprint material PNI-35A was prepared.

Example 36

In the same manner as in Example 34, except that the amount of DPEA-12 and the amount of the urethane acrylate (III) in Example 34 were changed to 0.5 g and 4.5 g, respectively, an imprint material PNI-36A was prepared.

Example 37

4.5 g of A-TMPT-3EO was mixed with 0.5 g of the urethane acrylate (IV) obtained in Synthesis Example 4 and to the resultant mixture, 0.25 g (5 phr based on the total mass of A-TMPT-3EO and the urethane acrylate (IV)) of DAROCUR1173 was added to prepare an imprint material PNI-37A. The urethane acrylate (IV) used in the present Example and Examples and Comparative Examples that are described below corresponds to the component (B).

Example 38

In the same manner as in Example 37, except that the amount of A-TMPT-3EO and the amount of the urethane acrylate (IV) in Example 37 were changed to 2.5 g and 2.5 g, respectively, an imprint material PNI-38A was prepared.

Example 39

In the same manner as in Example 37, except that the amount of A-TMPT-3EO and the amount of the urethane acrylate (IV) in Example 37 were changed to 0.5 g and 4.5 g, respectively, an imprint material PNI-39A was prepared.

Example 40

4.5 g of A-TMPT-9EO was mixed with 0.5 g of the urethane acrylate (IV) obtained in Synthesis Example 3 and to the resultant mixture, 0.25 g (5 phr based on the total mass of A-TMPT-9EO and the urethane acrylate (IV)) of DAROCUR1173 was added to prepare an imprint material PNI-40A.

Example 41

In the same manner as in Example 40, except that the amount of A-TMPT-9EO and the amount of the urethane acrylate (IV) in Example 40 were changed to 2.5 g and 2.5 g, respectively, an imprint material PNI-41A was prepared.

Example 42

In the same manner as in Example 40, except that the amount of A-TMPT-9EO and the amount of the urethane acrylate (IV) in Example 40 were changed to 0.5 g and 4.5 g, respectively, an imprint material PNI-42A was prepared.

Example 43

4.5 g of ATM-4E was mixed with 0.5 g of the urethane acrylate (IV) obtained in Synthesis Example 3 and to the resultant mixture, 0.25 g (5 phr based on the total mass of ATM-4E and the urethane acrylate (IV)) of DAROCUR1173 was added to prepare an imprint material PNI-43A.

Example 44

In the same manner as in Example 43, except that the amount of ATM-4E and the amount of the urethane acrylate (IV) in Example 43 were changed to 2.5 g and 2.5 g, respectively, an imprint material PNI-44A was prepared.

Example 45

In the same manner as in Example 43, except that the amount of ATM-4E and the amount of the urethane acrylate (IV) in Example 43 were changed to 0.5 g and 4.5 g, respectively, an imprint material PNI-45A was prepared.

Example 46

4.5 g of DPEA-12 was mixed with 0.5 g of the urethane acrylate (IV) obtained in Synthesis Example 3 and to the resultant mixture, 0.5 g (5 phr based on the total mass of DPEA-12 and the urethane acrylate (IV)) of DAROCUR1173 was added to prepare an imprint material PNI-46A.

Example 47

In the same manner as in Example 46, except that the amount of DPEA-12 and the amount of the urethane acrylate (IV) in Example 46 were changed to 2.5 g and 2.5 g, respectively, an imprint material PNI-47A was prepared.

Example 48

In the same manner as in Example 46, except that the amount of DPEA-12 and the amount of the urethane acrylate (IV) in Example 46 were changed to 0.5 g and 4.5 g, respectively, an imprint material PNI-48A was prepared.

Example 49

2.5 g of DPEA-12, 2.5 g of the urethane acrylate (I) obtained in Synthesis Example 1, and 0.005 g of acrylic acid were mixed with each other and to the resultant mixture, 0.125 g (2.5 phr based on the total mass of DPEA-12, the urethane acrylate (I), and acrylic acid) of Lucirin (registered trademark) TPO (manufactured by BASF Japan Ltd.) (hereinafter in the present specification, abbreviated as "Lucirin TPO") was added to prepare an imprint material PNI-49A. Lucirin TPO used in the present Example and Examples described below corresponds to the component (C).

Example 50

1.25 g of DPEA-12, 1.25 g of the urethane acrylate (I), and 2.5 g of acrylic acid were mixed with each other and to the resultant mixture, 0.125 g (2.5 phr based on the total mass of DPEA-12, the urethane acrylate (I), and acrylic acid) of Lucirin TPO was added to prepare an imprint material PNI-50A.

Example 51

In the same manner as in Example 49, except that the acrylic acid in Example 49 was changed to KAYARAD (registered trademark) NPGDA (manufactured by Nippon Kayaku Co., Ltd.) (hereinafter in the present specification, abbreviated as "NPGDA"), an imprint material PNI-51A was prepared. NPGDA used in the present Example and Examples described below has two polymerizable groups, but has no ethylene oxide unit, so that NPGDA does not correspond to the component (A).

Example 52

In the same manner as in Example 50, except that the acrylic acid in Example 50 was changed to NPGDA, an imprint material PNI-52A was prepared.

Example 53

In the same manner as in Example 49, except that the acrylic acid in Example 49 was changed to KAYARAD (registered trademark) PET-30 (manufactured by Nippon Kayaku Co., Ltd.) (hereinafter in the present specification, abbreviated as "PET-30"), an imprint material PNI-53A was prepared. PET-30 used in the present Example and Examples described below has a plurality of polymerizable groups, but has no ethylene oxide unit, so that PET-30 does not correspond to the component (A).

Example 54

In the same manner as in Example 50, except that the acrylic acid in Example 50 was changed to PET-30, an imprint material PNI-54A was prepared.

Example 55

In the same manner as in Example 49, except that the acrylic acid in Example 49 was changed to KAYARAD (registered trademark) DPHA (manufactured by Nippon Kayaku Co., Ltd.) (hereinafter in the present specification, abbreviated as "DPHA"), an imprint material PNI-55A was prepared. DPHA used in the present Example and Examples and Comparative Examples that are described below has a plurality of polymerizable groups, but has no ethylene oxide unit, so that DPHA does not correspond to the component (A).

Example 56

In the same manner as in Example 50, except that the acrylic acid in Example 50 was changed to DPHA, an imprint material PNI-56A was prepared.

Example 57

2.5 g of DPEA-12, 2.5 g of the urethane acrylate (I), 0.25 g of NK ester AM-30G (manufactured by Shin-Nakamura Chemical Co., Ltd.) (hereinafter in the present specification, abbreviated as "AM-30G"), and 2.75 g of NPGDA were mixed with each other and to the resultant mixture, 0.2 g (2.5 phr based on the total mass of DPEA-12, the urethane acrylate (I), AM-30G, and NPGDA) of Lucirin TPO was added to prepare an imprint material PNI-57A. AM-300 used in the present Example and Examples described below corresponds to the component (A).

Example 58

In the same manner as in Example 57, except that the amount of AM-300 and the amount of NPGDA in Example 57 were changed to 0.5 g and 2.5 g, respectively, an imprint material PNI-58A was prepared.

Example 59

In the same manner as in Example 57, except that the amount of AM-30G and the amount of NPGDA in Example 57 were changed to 0.75 g and 2.25 g, respectively, an imprint material PNI-59A was prepared.

Example 60

In the same manner as in Example 57, except that the amount of AM-30G and the amount of NPGDA in Example 57 were changed to 1 g and 2 g, respectively, an imprint material PNI-60A was prepared.

Example 61

In the same manner as in Example 49, except that the urethane acrylate (I) in Example 49 was changed to the urethane acrylate (II) obtained in Synthesis Example 2, an imprint material PNI-61 A was prepared.

Example 62

In the same manner as in Example 50, except that the urethane acrylate (I) in Example 50 was changed to the urethane acrylate (II) obtained in Synthesis Example 2, an imprint material PNI-62A was prepared.

Example 63

In the same manner as in Example 51, except that the urethane acrylate (I) in Example 51 was changed to the urethane acrylate (H) obtained in Synthesis Example 2, an imprint material PNI-63A was prepared.

Example 64

In the same manner as in Example 52, except that the urethane acrylate (I) in Example 52 was changed to the urethane acrylate (II) obtained in Synthesis Example 2, an imprint material PM-64A was prepared.

Example 65

In the same manner as in Example 53, except that the urethane acrylate (I) in Example 53 was changed to the urethane acrylate (II) obtained in Synthesis Example 2, an imprint material PNI-65A was prepared.

Example 66

In the same manner as in Example 54, except that the urethane acrylate (I) in Example 54 was changed to the urethane acrylate (II) obtained in Synthesis Example 2, an imprint material PNI-66A was prepared.

Example 67

In the same manner as in Example 55, except that the urethane acrylate (I) in Example 55 was changed to the urethane acrylate (II) obtained in Synthesis Example 2, an imprint material PNI-67A was prepared.

Example 68

In the same manner as in Example 56, except that the urethane acrylate (I) in Example 56 was changed to the urethane acrylate (II) obtained in Synthesis Example 2, an imprint material PNI-68A was prepared.

Example 69

In the same manner as in Example 57, except that the urethane acrylate (I) in Example 57 was changed to the urethane acrylate (II) obtained in Synthesis Example 2, an imprint material PNI-69A was prepared.

Example 70

In the same manner as in Example 58, except that the urethane acrylate (I) in Example 58 was changed to the urethane acrylate (II) obtained in Synthesis Example 2, an imprint material PNI-70A was prepared.

Example 71

In the same manner as in Example 59, except that the urethane acrylate (I) in Example 59 was changed to the urethane acrylate (II) obtained in Synthesis Example 2, an imprint material PNI-71A was prepared.

Example 72

In the same manner as in Example 60, except that the urethane acrylate (I) in Example 60 was changed to the urethane acrylate (II) obtained in Synthesis Example 2, an imprint material PNI-72A was prepared.

Example 73

In the same manner as in Example 49, except that the urethane acrylate (I) in Example 49 was changed to the urethane acrylate (III) obtained in Synthesis Example 3, an imprint material PNI-73A was prepared.

Example 74

In the same manner as in Example 50, except that the urethane acrylate (I) in Example 50 was changed to the urethane acrylate (III) obtained in Synthesis Example 3, an imprint material PNI-74A was prepared.

Example 75

In the same manner as in Example 51, except that the urethane acrylate (I) in Example 51 was changed to the urethane acrylate (III) obtained in Synthesis Example 3, an imprint material PNI-75A was prepared.

Example 76

In the same manner as in Example 52, except that the urethane acrylate (I) in Example 52 was changed to the urethane acrylate (III) obtained in Synthesis Example 3, an imprint material PNI-76A was prepared.

Example 77

In the same manner as in Example 53, except that the urethane acrylate (I) in Example 53 was changed to the urethane acrylate (III) obtained in Synthesis Example 3, an imprint material PNI-77A was prepared.

Example 78

In the same manner as in Example 54, except that the urethane acrylate (I) in Example 54 was changed to the urethane acrylate (III) obtained in Synthesis Example 3, an imprint material PNI-78A was prepared.

Example 79

In the same manner as in Example 55, except that the urethane acrylate (I) in Example 55 was changed to the urethane acrylate (III) obtained in Synthesis Example 3, an imprint material PNI-79A was prepared.

Example 80

In the same manner as in Example 56, except that the urethane acrylate (I) in Example 56 was changed to the urethane acrylate (III) obtained in Synthesis Example 3, an imprint material PNI-80A was prepared.

Example 81

In the same manner as in Example 57, except that the urethane acrylate (I) in Example 57 was changed to the urethane acrylate (III) obtained in Synthesis Example 3, an imprint material PNI-81A was prepared.

Example 82

In the same manner as in Example 58, except that the urethane acrylate (I) in Example 58 was changed to the urethane acrylate (III) obtained in Synthesis Example 3, an imprint material PNI-82A was prepared.

Example 83

In the same manner as in Example 59, except that the urethane acrylate (I) in Example 59 was changed to the urethane acrylate (III) obtained in Synthesis Example 3, an imprint material PNI-83A was prepared.

Example 84

In the same manner as in Example 60, except that the urethane acrylate (I) in Example 60 was changed to the urethane acrylate (III) obtained in Synthesis Example 3, an imprint material PNI-84A was prepared.

Example 85

In the same manner as in Example 49, except that the urethane acrylate (I) in Example 49 was changed to the urethane acrylate (IV) obtained in Synthesis Example 4, an imprint material PNI-85A was prepared.

Example 86

In the same manner as in Example 50, except that the urethane acrylate (I) in Example 50 was changed to the urethane acrylate (IV) obtained in Synthesis Example 4, an imprint material PNI-86A was prepared.

Example 87

In the same manner as in Example 51, except that the urethane acrylate (I) in Example 51 was changed to the urethane acrylate (IV) obtained in Synthesis Example 4, an imprint material PNI-87A was prepared.

Example 88

In the same manner as in Example 52, except that the urethane acrylate (I) in Example 52 was changed to the urethane acrylate (IV) obtained in Synthesis Example 4, an imprint material PNI-88A was prepared.

Example 89

In the same manner as in Example 53, except that the urethane acrylate (I) in Example 53 was changed to the urethane acrylate (IV) obtained in Synthesis Example 4, an imprint material PNI-89A was prepared.

Example 90

In the same manner as in Example 54, except that the urethane acrylate (I) in Example 54 was changed to the urethane acrylate (IV) obtained in Synthesis Example 4, an imprint material PNI-90A was prepared.

Example 91

In the same manner as in Example 55, except that the urethane acrylate (I) in Example 55 was changed to the urethane acrylate (IV) obtained in Synthesis Example 4, an imprint material PNI-91A was prepared.

Example 92

In the same manner as in Example 56, except that the urethane acrylate (I) in Example 56 was changed to the urethane acrylate (IV) obtained in Synthesis Example 4, an imprint material PNI-92A was prepared.

Example 93

In the same manner as in Example 57, except that the urethane acrylate (I) in Example 57 was changed to the urethane acrylate (IV) obtained in Synthesis Example 4, an imprint material PNI-93A was prepared.

Example 94

In the same manner as in Example 58, except that the urethane acrylate (I) in Example 58 was changed to the urethane acrylate (IV) obtained in Synthesis Example 4, an imprint material PNI-94A was prepared.

Example 95

In the same manner as in Example 59, except that the urethane acrylate (I) in Example 59 was changed to the urethane acrylate (IV) obtained in Synthesis Example 4, an imprint material PNI-95A was prepared.

Example 96

In the same manner as in Example 60, except that the urethane acrylate (I) in Example 60 was changed to the urethane acrylate (IV) obtained in Synthesis Example 4, an imprint material PNI-96A was prepared.

Comparative Example 1

4.5 g of DPHA was mixed with 0.5 g of the urethane acrylate (I) obtained in Synthesis Example 1 and to the resultant mixture, 0.5 g (5 phr based on the total mass of DPHA and the urethane acrylate (I)) of DAROCUR1173 was added to prepare an imprint material PNI-1B. The present Comparative Example and Comparative Examples described below are examples not containing the component (A) that is an essential component of the present invention.

Comparative Example 2

In the same manner as in Comparative Example 1, except that the amount of DPHA and the amount of the urethane acrylate (I) in Comparative Example 1 were changed to 2.5 g and 2.5 g, respectively, an imprint material PNI-2B was prepared.

Comparative Example 3

In the same manner as in Comparative Example 13, except that the amount of DPHA and the amount of the urethane acrylate (I) in Comparative Example 1 were changed to 0.5 g and 4.5 g, respectively, an imprint material PNI-3B was prepared.

Comparative Example 4

To 5 g of the urethane acrylate (I) obtained in Synthesis Example 1, 0.25 g (5 phr based on the mass of the urethane acrylate (I)) of DAROCUR1173 was added to prepare an imprint material PNI-4B.

Comparative Example 5

4.5 g of DPHA was mixed with 0.5 g of the urethane acrylate (II) obtained in Synthesis Example 2 and to the resultant mixture, 0.25 g (5 phr based on the total mass of DPHA and the urethane acrylate (II)) of DAROCUR1173 was added to prepare an imprint material PNI-5B.

Comparative Example 6

In the same manner as in Comparative Example 5, except that the amount of DPHA and the amount of the urethane acrylate (H) in Comparative Example 5 were changed to 2.5 g and 2.5 g, respectively, an imprint material PNI-6B was prepared.

Comparative Example 7

In the same manner as in Comparative Example 5, except that the amount of DPHA and the amount of the urethane acrylate (II) in Comparative Example 5 were changed to 0.5 g and 4.5 g, respectively, an imprint material PNI-78 was prepared.

Comparative Example 8

To 5 g of the urethane acrylate (II) obtained in Synthesis Example 2, 0.25 g (5 phr based on the mass of the urethane acrylate (II)) of DAROCUR1173 was added to prepare an imprint material PNI-8B.

Comparative Example 9

4.5 g of DPHA was mixed with 0.5 g of the urethane acrylate (III) obtained in Synthesis Example 3 and to the resultant mixture, 0.25 g (5 phr based on the total mass of DPHA and the urethane acrylate (III)) of DAROCUR1173 was added to prepare an imprint material PNI-9B.

Comparative Example 10

In the same manner as in Comparative Example 9, except that the amount of DPHA and the amount of the urethane acrylate (III) in Comparative Example 9 were changed to 2.5 g and 2.5 g, respectively, an imprint material PNI-10B was prepared.

Comparative Example 11

In the same manner as in Comparative Example 9, except that the amount of DPHA and the amount of the urethane acrylate (III) in Comparative Example 9 were changed to 0.5 g and 4.5 g, respectively, an imprint material PNI-11B was prepared.

Comparative Example 12

To 5 g of the urethane acrylate (III) obtained in Synthesis Example 3, 0.25 g (5 phr based on the mass of the urethane acrylate (III)) of DAROCUR1173 was added to prepare an imprint material PNI-12B.

Comparative Example 13

4.5 g of DPHA was mixed with 0.5 g of the urethane acrylate (IV) obtained in Synthesis Example 4 and to the resultant mixture, 0.25 g (5 phr based on the total mass of DPHA and the urethane acrylate (IV)) of DAROCUR1173 was added to prepare an imprint material PNI-1313.

Comparative Example 14

In the same manner as in Comparative Example 13, except that the amount of DPHA and the amount of the urethane acrylate (IV) in Comparative Example 13 were changed to 2.5 g and 2.5 g, respectively, an imprint material PNI-14B was prepared.

Comparative Example 15

In the same manner as in Comparative Example 13, except that the amount of DPHA and the amount of the urethane acrylate (IV) in Comparative Example 13 were changed to 0.5 g and 4.5 g, respectively, an imprint material PNI-15B was prepared.

Comparative Example 16

To 5 g of the urethane acrylate (IV) obtained in Synthesis Example 4, 0.25 g (5 phr based on the mass of the urethane acrylate (IV)) of DAROCUR1173 was added to prepare an imprint material PNI-16B.

[Photoimprint]

As a nano-imprint apparatus, NM-0801 HB (manufactured by Meisyo Kiko Co., Ltd.) was used. Each of the imprint materials obtained in Example 1 to Example 96 and Comparative Example 1 to Comparative Example 16 was subjected to a patterning test. The mold used for the patterning test was made of silicon and as the pattern, two types of patterns such as a line and space pattern (hereinafter in the present specification, abbreviated as L/S) of 100 nm and a moth-eye pattern (manufactured by NTT Advanced Technology Corporation) (hereinafter in the present specification, abbreviated as moth-eye) in an equilateral triangle array having a pitch of 270 nm and a height of 350 nm were used. The mold was immersed beforehand in a solution produced by diluting OPTOOL (registered trademark) DSX (manufactured by Daikin Industries, Ltd.) with Novec HFE-7100 (manufactured by Sumitomo 3M Limited) (hereinafter in the present specification, abbreviated as Novec HFE-7100) to 0.1% by mass, was subjected to a treatment using a high temperature-high humidity apparatus of a temperature of 90° C. and a humidity of 90 RH % for 1 hour, was rinsed with Novec HFE-7100, and was dried with air to be used.

[Steel Wool Abrasion Resistance Test]

As the testing machine, a testing machine manufactured by Daiei Seiki Ltd. was used and a steel wool of #0000 was used. The load per unit area was set at 380 g/cm² and the steel wool was reciprocated for ten times. For the L/S pattern, the steel wool was reciprocated in a direction perpendicular to the line. The result of an evaluation with respect to the number of pieces of scratch after the abrasion is shown in Tables 1 to 4.

0 to 10 pieces: A
11 to 20 pieces: B
21 to 30 pieces: C
31 to 40 pieces: D
41 pieces or more: E A glass substrate was spin-coated with the imprint material PNI-1A obtained in Example 1 and in a state in which a silicon mold was adhered to the imprint material, was set in a photoimprint apparatus. Photoimprint was performed under a condition of at 23° C. all the time according to a sequence of a) pressurizing to 1,000 N over 10 seconds, b) exposing to light of 500 mJ/cm² using a high pressure mercury lamp, c) depressurizing over 10 seconds, and d) mold-releasing by separating the substrate from the mold to obtain a film to which an L/S pattern was transferred and a film to which a moth-eye pattern was transferred. Then, each film was subjected to the steel wool abrasion resistance test. At this time, the film having an L/S pattern was subjected to the abrasion resistance test in a direction perpendicular to the line. Then, the number of pieces of scratch after the test was observed.

By the same method as described above, except that each of the imprint materials obtained in Example 2 to Example 96 was used, the film was subjected to the photoimprint and the steel wool abrasion resistance test.

By the same method as described above, except that each of the imprint materials obtained in Comparative Example 1 to Comparative Example 16 was used, the film was subjected to the photoimprint and the steel wool abrasion resistance test.

TABLE 1

|  | Scratch | |
| --- | --- | --- |
|  | L/S | Moth-eye |
| Example 1 | B | B |
| Example 2 | A | A |
| Example 3 | B | B |
| Example 4 | B | B |
| Example 5 | A | A |
| Example 6 | B | B |
| Example 7 | B | B |
| Example 8 | A | A |
| Example 9 | B | B |
| Example 10 | B | B |
| Example 11 | A | A |
| Example 12 | B | B |
| Example 13 | B | B |
| Example 14 | A | A |
| Example 15 | B | B |
| Example 16 | B | B |
| Example 17 | A | A |
| Example 18 | B | B |
| Example 19 | B | B |
| Example 20 | A | A |
| Example 21 | B | B |
| Example 22 | B | B |
| Example 23 | A | A |
| Example 24 | B | B |
| Example 25 | B | B |

TABLE 1-continued

|  | Scratch | |
| --- | --- | --- |
|  | L/S | Moth-eye |
| Example 26 | A | A |
| Example 27 | B | B |
| Example 28 | B | B |
| Example 29 | A | A |
| Example 30 | B | B |
| Example 31 | B | B |
| Example 32 | A | A |

TABLE 2

|  | Scratch | |
| --- | --- | --- |
|  | L/S | Moth-eye |
| Example 33 | B | B |
| Example 34 | B | B |
| Example 35 | A | A |
| Example 36 | B | B |
| Example 37 | B | B |
| Example 38 | A | A |
| Example 39 | B | B |
| Example 40 | B | B |
| Example 41 | A | A |
| Example 42 | B | B |
| Example 43 | B | B |
| Example 44 | A | A |
| Example 45 | B | B |
| Example 46 | B | B |
| Example 47 | A | A |
| Example 48 | B | B |
| Example 49 | A | A |
| Example 50 | B | B |
| Example 51 | A | A |
| Example 52 | B | B |
| Example 53 | A | A |
| Example 54 | B | B |
| Example 55 | A | A |
| Example 56 | B | B |
| Example 57 | A | A |
| Example 58 | A | A |
| Example 59 | A | A |
| Example 60 | A | A |
| Example 61 | A | A |
| Example 62 | B | B |
| Example 63 | A | A |
| Example 64 | B | B |

TABLE 3

|  | Scratch | |
| --- | --- | --- |
|  | L/S | Moth-eye |
| Example 65 | A | A |
| Example 66 | B | B |
| Example 67 | A | A |
| Example 68 | B | B |
| Example 69 | A | A |
| Example 70 | A | A |
| Example 71 | A | A |
| Example 72 | A | A |
| Example 73 | A | A |
| Example 74 | B | B |
| Example 75 | A | A |
| Example 76 | B | B |
| Example 77 | A | A |
| Example 78 | B | B |
| Example 79 | A | A |
| Example 80 | B | B |
| Example 81 | A | A |
| Example 82 | A | A |

TABLE 3-continued

| | Scratch | |
| --- | --- | --- |
| | L/S | Moth-eye |
| Example 83 | A | A |
| Example 84 | A | A |
| Example 85 | A | A |
| Example 86 | B | B |
| Example 87 | A | A |
| Example 88 | B | B |
| Example 89 | A | A |
| Example 90 | B | B |
| Example 91 | A | A |
| Example 92 | B | B |
| Example 93 | A | A |
| Example 94 | A | A |
| Example 95 | A | A |
| Example 96 | A | A |

TABLE 4

| | Scratch | |
| --- | --- | --- |
| | L/S | Moth-eye |
| Comparative Example 1 | E | E |
| Comparative Example 2 | E | E |
| Comparative Example 3 | E | E |
| Comparative Example 4 | D | D |
| Comparative Example 5 | E | E |
| Comparative Example 6 | E | E |
| Comparative Example 7 | E | E |
| Comparative Example 8 | D | D |
| Comparative Example 9 | E | E |
| Comparative Example 10 | E | E |
| Comparative Example 11 | E | E |
| Comparative Example 12 | D | D |
| Comparative Example 13 | E | E |
| Comparative Example 14 | E | E |
| Comparative Example 15 | E | E |
| Comparative Example 16 | D | D |

From the result of Table 1 to Table 3, in any case where the imprint materials obtained in Example 1 to Example 96 were used, the number of pieces of scratch caused after the steel wool abrasion resistance test was small and abrasion resistance was confirmed. On the other hand, from the result of Table 4, in any case where the imprint materials obtained in Comparative Example 1 to Comparative Example 16 were used, a large number of pieces of scratch were caused and satisfactory abrasion resistance was not observed. From the result above, the film obtained by coating a base material with the imprint material of the present invention has abrasion resistance also after the imprint.

INDUSTRIAL APPLICABILITY

The film obtained from the imprint material of the present invention can be suitably applied to a product using a member for which abrasion resistance is required such as a solid-state image sensor (CCD image sensor, CMOS image sensor, and the like), a solar battery, an LED device, a display (liquid crystal display, EL display, and the like), and a signboard (display board) located outside.

The invention claimed is:

1. An imprint material comprising:
    a component (A): a compound having at least one ethylene oxide unit and having at least one polymerizable group;
    a component (B): a polycaprolactone-modified urethane compound having a $C_{13-25}$ long chain alkyl group and at least one polymerizable group, wherein
        the component (B) is a compound obtained by causing a reaction product between an organic isocyanate having in one molecule thereof, at least three isocyanate groups and an alcohol having a $C_{13-25}$ long chain alkyl group to react with polycaprolactone-modified hydroxyethyl (meth)acrylate; and
    a component (C): a photopolymerization initiator.

2. The imprint material according to claim 1, wherein the concentration of the ethylene oxide unit per one molecule of the compound of the component (A) is 20% or more and 80% or less.

3. The imprint material according to claim 1, wherein the component (A) comprises at least two compounds.

4. The imprint material according to claim 1, wherein a ratio of the component (B) relative to the total mass of the component (A) and the component (B) is 10% by mass to 90% by mass.

5. The imprint material according to claim 1, further comprising a surfactant as a component (D).

6. The imprint material according to claim 1, further comprising a solvent as a component (E).

7. The imprint material according to claim 1, wherein the component (A) and the component (B) are each a compound having as the polymerizable group, at least one selected from the group consisting of an acryloyloxy group, a methacryloyloxy group, a vinyl group, and an allyl group.

8. A film to which a pattern is transferred, the film being produced from the imprint material as claimed in claim 1.

9. A member comprising the film to which a pattern is transferred as claimed in claim 8 on a base material.

10. A solid-state image sensor comprising the film to which a pattern is transferred as claimed in claim 8 on a base material.

11. An LED device comprising the film to which a pattern is transferred as claimed in claim 8 on a base material.

12. A solar battery comprising the film to which a pattern is transferred as claimed in claim 8 on a base material.

13. A display comprising the film to which a pattern is transferred as claimed in claim 8 on a base material.

14. An electronic device comprising the film to which a pattern is transferred as claimed in claim 8 on a base material.

* * * * *